(12) United States Patent
Huard

(10) Patent No.: US 11,480,597 B2
(45) Date of Patent: Oct. 25, 2022

(54) METHOD AND APPARATUS FOR ANALYZING A RELATIONSHIP BETWEEN TONE FREQUENCIES AND SPURIOUS FREQUENCIES

(71) Applicant: Rohde & Schwarz GmbH & Co. KG, Munich (DE)

(72) Inventor: Rich Huard, Columbia, MD (US)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 13 days.

(21) Appl. No.: 16/744,527

(22) Filed: Jan. 16, 2020

(65) Prior Publication Data

US 2021/0223300 A1  Jul. 22, 2021

(51) Int. Cl.
*G01R 23/20* (2006.01)
*G10H 1/04* (2006.01)
*G10H 1/06* (2006.01)

(52) U.S. Cl.
CPC ............ *G01R 23/20* (2013.01); *G10H 1/04* (2013.01); *G10H 1/06* (2013.01)

(58) Field of Classification Search
None
See application file for complete search history.

(56) References Cited

U.S. PATENT DOCUMENTS

| | | | | |
|---|---|---|---|---|
| 5,615,302 A * | 3/1997 | McEachern | ............ | G10L 25/90 704/200.1 |
| 6,115,464 A * | 9/2000 | Lester | ............ | H04Q 1/457 327/39 |
| 6,603,707 B1 * | 8/2003 | Meunier | ............ | G01V 1/005 367/189 |
| 2003/0222652 A1 * | 12/2003 | Martens | ............ | G01R 23/20 324/520 |
| 2004/0160286 A1 * | 8/2004 | Ward | ............ | H03J 3/08 331/185 |

(Continued)

FOREIGN PATENT DOCUMENTS

CN       1133877 C       1/2004

OTHER PUBLICATIONS

Expace.net, machine translation, Nentwig, Markus, "Method and Apparatus for Mitigating Effects of Spurious Tones in a Transceiver," May 16, 2012 (Year: 2012).*

*Primary Examiner* — Eman A Alkafawi
*Assistant Examiner* — Denise R Karavias
(74) *Attorney, Agent, or Firm* — Westman, Champlin & Koehler, P.A.

(57) ABSTRACT

An improved analysis and determination of a relationship between a tone frequency and spurious frequencies is provided. A device under test is operated to generate signals based on multiple different tone frequencies. For each tone frequency a spectrum of the generated signal is measured and spurious frequencies in the generated signal are identified. Based on the measured spectrums a representation of the spurious frequencies versus the related tone frequencies is generated. Trajectories may be inserted into the representation for indicating relationships between the tone frequencies and the spurious frequencies. This representation provides a useful basis for a fast and reliable identification of relationships between spurious frequencies and tone frequencies.

20 Claims, 4 Drawing Sheets

(56) References Cited

U.S. PATENT DOCUMENTS

| | | | | |
|---|---|---|---|---|
| 2006/0290548 A1* | 12/2006 | Goyal | ................. | H03M 1/12 |
| | | | | 341/120 |
| 2009/0258629 A1* | 10/2009 | Ritchey | ................. | H03D 7/161 |
| | | | | 455/313 |
| 2013/0234728 A1* | 9/2013 | Olgaard | ............. | G01R 31/2841 |
| | | | | 324/633 |
| 2014/0355459 A1* | 12/2014 | Rafique | ................. | H04B 15/06 |
| | | | | 370/252 |
| 2015/0145528 A1* | 5/2015 | Yeo | ................. | G01R 29/10 |
| | | | | 324/629 |
| 2019/0109606 A1* | 4/2019 | Delos | ................. | H04B 1/0475 |

* cited by examiner

US 11,480,597 B2

METHOD AND APPARATUS FOR ANALYZING A RELATIONSHIP BETWEEN TONE FREQUENCIES AND SPURIOUS FREQUENCIES

TECHNICAL FIELD

The present invention relates to a method for analyzing a relationship between tone frequencies and spurious frequencies. The present invention further relates to an apparatus for analyzing a relationship between tone frequencies and a spurious frequency.

BACKGROUND

Although applicable in principle to any device dealing with AC signals, the present invention and its underlying problem will be hereinafter described in combination with a device generating radio frequency signals.

When generating a radio frequency signal, for instance by a signal generator or the like, a generated radio frequency signal may comprise not only frequency components of a desired frequency (tone frequency), but also components of one or more further, unwanted frequencies (spurious frequencies). For example, a frequency signal may be generated by means of a digital-to-analogue converter (DAC), which is operated by a specific clock rate. This clock rate may cause unwanted additional frequency components. Furthermore, a frequency signal may be obtained by mixing frequency signals. Accordingly, these frequencies may also have impact to the frequency components of an output signal. Furthermore, there may be many other sources, which could lead to unwanted additional frequency components in a frequency signal.

Thus, when measuring a frequency signal such as a radio frequency signal, a measurement device will measure not only the desired frequency, but also the additional spurious frequency components. During development or maintenance of a device it may be desirable to identify the sources of the spurious frequencies. Based on this knowledge, it may be possible to eliminate or reduce spurious frequencies, or to mask out spurious frequencies when analyzing a measurement result.

Against this background, a problem addressed by the present invention is to provide a clear and versatile analysis of a relationship between a tone frequency and spurious frequencies.

SUMMARY

The present invention solves this object by a method and an apparatus for analyzing a relationship between tone frequencies and spurious frequencies with the features of the independent claims. Further advantageous embodiments are subject-matter of the dependent claims.

According to a first aspect, a method for analyzing a relationship between tone frequencies and spurious frequencies is provided. The method comprises operating a device under test to output a number of multiple signals. In particular, each signal, which is output by the device under test, may relate to a predetermined tone frequency. The number of signals may be output sequentially one by one. For example, the operation of the device under test may be controlled by a controller. The method further comprises measuring a spectrum of each signal, which is output by the device under test. For example, the spectrum of the output signals may be measured by a measurement device. Further, the method identifies spurious frequencies in each of the measured spectrums. In a further step, a representation of the identified spurious frequencies in the measured spectrum versus the related tone frequency is generated. The identification of the spurious frequencies and the generation of the representation may be performed by a processor.

According to a further aspect, an apparatus for analyzing a relationship between tone frequencies and spurious frequencies is provided. The apparatus comprises a controller, a measurement device and a processor. The controller is configured to operate a device under test to output a number of multiples signals. Each signal may relate to a predetermined tone frequency. In particular, the number of signals may be output sequentially one by one. The measurement device is configured to measure a spectrum of each signal, which is output by the device under test. The processor is configured to identify spurious frequencies in each of the measured spectrums. The processor is further configured to generate a representation of the identified spurious frequencies in a measured spectrum versus the related tone frequency.

The present invention is based on the finding that a desired frequency (tone frequency) used in a device may come along with a number of one or more related frequencies, which are usually unwanted (spurious frequencies). For example, spurious frequency components in a signal may be caused by any kinds of harmonics, by products of a clock signal or by the input signals of a mixing process. However, there may be also any other causes which lead to spurious frequencies. Since the resulting spurious frequencies may be based on multiple known or even unknown intermediate signals, it may be difficult to identify a source causing a specific spurious frequency. In particular, since there may be a more or less complex relationship between a tone frequency and a spurious frequency, it may be difficult to identify relationships between the tone frequency and the spurious frequencies.

The present invention takes into account this finding and aims to provide a versatile and improved assistance for analyzing and identifying relationships between a tone frequency and spurious frequencies, which occur in a device under test. It is for this purpose that spurious frequencies are identified for multiple different tone frequencies, and a diagram is generated, in which the spurious frequencies are provided versus the corresponding tone frequency. In this way, a representation is obtained, which allows the user to easily identify relationships between spurious frequencies and corresponding tone frequencies.

The device under test may be any kind of device dealing with frequency signals, in particular dealing with radio frequency signals. For example, the device under test may be a device comprising a signal generator for generating a radio frequency signal. For example, the signal generator may comprise a digital-to-analogue converter for converting digital data to a corresponding analogue radio frequency signal. The device under test may use one or more internal clock signals. The clock signals may be used, for example, for providing an appropriate clock rate to a digital-to-analogue converter or the like. However, the clock signals may be also used for any other purposes. The device under test may further use, for example, mixers for combining signals. Furthermore, the device under test may comprise any other kind of element, which may be used for generating or modifying signals, in particular radio frequency signals. In particular, the device under test may be configured to generate at least one signal, wherein the frequency of the generated signal may be adjustable. For example, it may be possible to control the frequency of the respective signal by means of specific control commands or by providing an appropriate external signal. Furthermore, any other scheme for adjusting the frequency of the signal of the device under test may be possible, too.

The operation of the device under test, in particular the generation of a specific frequency by the device under test, may be controlled by an external device, for example a controller of the apparatus for analyzing the relationship between a tone frequency and spurious frequencies. For this purpose, the controller may communicatively be coupled with the device under test. For example, a wired or wireless connection may be established between the controller and the device under test. Accordingly, the controller and device under test may comprise appropriate communication interfaces for establishing such a communication between the controller and the device under test.

By controlling the operation of the device under test, in particular by controlling the frequency, which is generated by the device under test, it is possible to cause the device under test to generate specific tone frequencies. In particular, it is possible to control the device under test such that a sequence of multiple different tone frequencies is generated, wherein the individual tone frequencies are generated subsequently one by one. In this way, separate measurements can be performed for each specific tone frequency. For each signal which is output by the device under test and which relates to a specific tone frequency, a measurement may be performed for measuring a spectrum of the respective signal. In particular, the measurement may determine frequency components which are comprised by the respective signal provided by the device under test. For this purpose, an appropriate measurement device may be used. For example, the measurement device may comprise a spectrum analyzer or the like, which is configured to operate in an appropriate frequency range. Accordingly, the measurement result may provide an appropriate spectrum of frequency components, wherein a separate spectrum is measured for each tone frequency.

The measured spectrums which relate to the multiple tone frequencies may be analyzed in order to identify one or more spurious frequencies. Spurious frequencies may be any kind of frequency components in a spectrum, which are different from the desired tone frequency. If appropriate, the frequency range of the measured spectrum and/or the frequency range in which spurious frequencies are identified, may be limited to a specific predetermined frequency range. This frequency range may be a predetermined fixed frequency range. Alternatively, it may be also possible to set the frequency range individually depending on the related device under test or depending on further constraints.

After measuring the spectrums for all desired tone frequencies and identifying the related spurious frequencies, a representation of the results may be generated. For this purpose, a representation of the identified spurious frequencies in each measured spectrum versus the related tone frequency may be generated. For example, a two-dimensional diagram may be generated, wherein a first axis, e.g. the X-axis, may represent the tone frequency, and a further axis, e.g. the Y-axis may represent the spurious frequencies. Furthermore, each identified frequency, in particular each identified spurious frequency, may be represented by an appropriate graphical element. In particular, it may be possible to indicate an amplitude of the respective spurious frequency by adapting the properties of the graphical element indicating the respective frequency component. For example, a color, a size or a shape of the graphical element may be adapted depending on the amplitude or signal strength of the respective frequency component. In this way, the results of the analysis can be provided in a clear manner, and consequently a user may easy grasp the illustrated results.

However, any other manner for indicating the measured frequency components may be possible, too. For example, it may be also possible to generate a three-dimensional diagram, wherein a first axis represents the tone frequency, a second axis represents the spurious frequency and a third axis represents an amplitude or signal strength. In such a case, a perspective view of the three-dimensional representation may be generated in order to provide the three-dimensional diagram on a two-dimensional display.

The analysis for identifying the spurious frequencies in the measured spectrums and the generation of the representation may be performed, for example, by a processor. In particular, the processor may be communicatively coupled with the measurement device for measuring the spectrums and the controller for operating the device under test. However, the controller for controlling the device under test may be also implemented in the processor for analyzing the measurement results and generating the representation.

After generating the representation of the spurious frequencies versus the related tone frequencies, the representation may be provided to a user. For example, the representation may be shown on a display. In particular, the apparatus for analyzing the relationship between the tone frequencies and the spurious may comprise any kind of display for providing the generated representation. Alternatively, it may be also possible to connect an external display such as a computer screen or the like for providing the generated representation. Any other kind of providing the generated representation may be possible, too.

Furthermore, the generated representation may be also forwarded to a further device, for example, an external computer or the like for a further analysis. For example, the representation may also comprise a table such as a matrix or the like, wherein a first dimension represents the tone frequencies and a second dimension represents the spurious frequencies. Accordingly, the individual cells of the table or matrix may comprise values representing an amplitude or signal strength of the related frequency components. Accordingly, such a table or matrix may be used as a basis for a further analysis in order to determine the relationship between the tone frequencies and the spurious frequencies. Furthermore, any other scheme for providing the measurement results in a form comprising the frequency components in a representation of the tone frequencies versus the spurious frequencies may be also possible.

The controller and the processor may comprise, for example, a general purpose processor with corresponding instructions. Further, the controller and the processor may comprise interfacing elements for receiving signals on the device under test or providing signals to the device under test. The controller and/or the processor may be controlled by instructions that cause the controller and the processor to perform the desired operations. For this purpose, the processor and the controller may comprise a processing unit that is coupled to a memory, for example via memory bus. The memory may store instructions that cause the processor or the controller to perform the desired operations.

Further embodiments of the present invention are subject of the further sub-claims and of the following description, referring to the drawings.

In a possible embodiment, a predetermined number of one or more strongest spurious frequencies in each measured spectrum may be determined. The determination may be performed, for example by the processor.

By determining a predetermined number of strongest spurious frequencies, the number of spurious frequencies which are included in the representation of the spurious frequencies versus the tone frequencies can be limited. In this way, the analysis of the relationship between the tone frequencies in spurious frequencies may be simplified, since weak spurious frequencies may be not taken into account. For example, the number of spurious frequencies may be limited to a maximum of three spurious frequencies per tone frequency. However, any other number of spurious frequencies relating to a specific tone frequency may be possible, too. For example, an amplitude of the frequency component in the determined spectrum may be taken into account for identifying the strongest spurious frequencies.

In a possible embodiment, the generation of the representation of the spurious frequencies versus the tone frequencies may generate a separate representation, which takes into account only the strongest spurious frequency in each measured spectrum.

Furthermore, separate representations of spurious frequencies versus tone frequencies may be generated for each identified spurious frequency, wherein the spurious frequencies are sorted based on the signal strength/amplitude of the spurious frequencies. In this way, by limiting the number of spurious frequencies in the respective representations depending on the signal strength, the analysis for identifying the relationship between a spurious frequency and the tone frequency may be simplified.

In a possible embodiment, the method may comprise a step of creating a further representation of amplitudes. In particular, a representation of amplitudes for a strongest spurious frequency for each measured spectrum versus the related tone frequencies may be created. Accordingly, the additional representation may illustrate that only an existence of a spurious frequency, but also a signal strength/amplitude of at least the component of a spurious frequency having the highest amplitude.

In a possible embodiment, a number of one or more trajectories of theoretical spurious frequencies versus tone frequencies may be computed. Accordingly, the computed trajectories may be included in the generated representation of the identified spurious frequencies versus the tone frequencies. In particular, the computation of the trajectories and the combination of the computed trajectories with the general representation may be performed by the processor.

By computing such trajectories and including these trajectories in the representation of the determined spurious frequencies, a user may be further assisted when analyzing the measurement results and identifying relationships between the spurious frequencies and the related tone frequencies. For example, the trajectories may be specific lines representing a linear relationship between theoretical spurious frequencies and the tone frequencies. However, it is understood, that the trajectories may also represent other relationships, in particular non-linear relationships. For example, relationships with a higher order, e.g. squared or cubic factors or the like or logarithmic relationships may be also computed and included in the representation.

In a possible embodiment, the computed trajectories are based on at least one of harmonics, subharmonics, aliased harmonics, mixing products or a clock frequency of the device under test or another signal source emitting unwanted signals.

For example, trajectories may be computed based on any kind of harmonics. For this purpose, the tone frequency may be multiplied with a related factor. If appropriate, an offset may be also added. Furthermore, if a frequency is generated based on a combination of two or more intermediate frequencies, the related intermediate frequencies or at least some of the intermediate frequencies may be also taken into account for computing appropriate trajectories. If the device under test uses one or more clock frequencies, the respective clock frequencies may be also taken into account. Especially, if a clock frequency is divided by one or more factors, it may also possible to use not only the original clock frequency, but also the processed clock frequencies. For example, the trajectory may be also computed based on the original clock frequency divided by a specific fixed or variable number. Furthermore, any kind of combinations of the above-mentioned features or further features may be also taken into account for determining a trajectory. In particular, it may be possible to add a specific offset or subtract an intermediate result based on the above-mentioned features from a specific value or offset. However, it is understood, that any other kind of basis may be also used for computing appropriate trajectories. In particular, it may be possible to take into account not only the properties of the device under test, but also further signal sources such as other devices in the environment of the device under test which may emit unwanted signals.

In a possible embodiment, a selection of one or more predetermined trajectories may be received. For this purpose, the apparatus may comprise an input device for receiving an appropriate selection of one or more trajectories. Accordingly, the selected one or more trajectories may be included in the generated representation of the spurious frequencies versus the tone frequencies.

By selecting one or more predetermined trajectories, a user may compare the respective trajectories with the representation of the spurious frequencies versus the tone frequencies. Accordingly, the user can easily recognize, whether or not the selected trajectory fits the spurious frequencies in the representation. In this way, the user can easily determine whether or not the selected trajectory fits to the respective relationship of the spurious frequency with respect to the tone frequency.

However, it is understood, that it may be also possible to automatically analyze the results of the spurious frequencies versus the tone frequencies and to identify an appropriate trajectory. For example, the analysis and a selection of an appropriate trajectory may be automatically performed by the processor or another device. Accordingly, the automatically selected trajectory may be included in the representation of the spurious frequencies versus the tone frequencies. Additionally, an indication of the properties of this trajectory may be also provided in order to indicate the respective relationship to a user.

In a possible embodiment, one or more characteristic parameters of the device under test may be received. Accordingly, the number of trajectories may be computed based on the received one or more characteristic parameters of the device under test.

For example, the characteristic parameters of the device under test may comprise at least one of a clock rate, intermediate frequencies used in the device under test, further frequencies used in the device under test, etc. However, any other kind of characteristic parameter may be also taken into account for determining trajectories. In particular, the characteristic parameters may relate to an architecture of the device under test. For example, the architecture may consider a use of mixers, couplers, filters, converters, digital-to-analogue converters or any other element used by the device under test.

In a possible embodiment, the one or more characteristic parameters of the device under test may be provided by a user. Accordingly, the characteristic parameters may be received from a user interface.

Accordingly, a user can manually input the required parameters for specifying characteristics of the device under test. These parameters may be taken into account for computing trajectories, which can be used in order to analyze a relationship between spurious frequencies and tone frequencies.

In a possible embodiment, the one or more characteristic parameters of the device under test may be measured by a measurement device.

For example, characteristic parameters of the device under test may be measured by a spectrum analyzer or any other device for measuring appropriate parameters, in particular frequencies used in device under test. The measurement results may be provided, for example based on waterfall diagrams, spectrograms, or any other kind of measurement results, in particular measurement results indicating frequencies. In particular, the results for determining the characteristic parameters of the device under test may be measured independent of the process for measuring the spurious frequencies and the operation of controlling device under test to operate at specific tone frequencies. However, it may be also possible to acquire the respective data for determining the characteristic parameters of the device under test during the measurement operation for determining the relationship between the spurious frequencies and the tone frequencies.

In a possible embodiment, the one or more characteristic parameters of the device under test may be computed based on a simulation of the device under test. In particular, a simulation device may be provided for simulating the device under test.

For example, a model of the device under test may be used for simulating the operation of the device under test. Accordingly, further frequency sources such as oscillators or the like may be identified. However, any other kind of relevant element such as a divider for dividing a clock signal or another frequency signal, mixers, couplers etc. may be taken into account in the simulation. Accordingly, the simulation results, in particular frequencies identified during the simulation may be taken into account for determining the trajectories.

In a possible embodiment, each signal generated by the device under test may comprise multiple frequencies, a modulated signal having a carrier according to a tone frequency or a signal related to a specific channel, wherein the channel is specified by a tone frequency.

For example, the device under test may be operated such that the device under test may generate a signal comprising multiple frequency components. The multiple frequency components may relate to a specific frequency specified by a respective tone frequency. Furthermore, it may be possible that the device under test may generate a modulated signal, wherein the modulated signal is a specific carrier. The specific carrier may be based on a respective tone frequency. It is understood, that any kind of modulation may be used. Further, a tone frequency may specify a specific channel, and the device under test may be operated such that the device under test generates a signal related to the specific channel specified by the respective tone frequency. In particular, signals relating to multiple frequencies in such a channel may be generated. However, any other scheme for generating signals according to a specific tone frequency may be possible, too.

With the present invention it is possible to easily analyze spurious frequencies. In particular, it is possible to easily analyze relationships between tone frequencies and spurious frequencies. For this purpose, a device under test is operated by multiple tone frequencies and for each tone frequency, related spurious frequencies are identified. The identified spurious frequencies are provided in a representation of the spurious frequencies versus the tone frequencies. In particular, the number of the identified spurious frequencies may be limited to a predetermined number of maximum spurious frequencies, which are shown in the representation. The generated representation allows a quick and easy analysis in order to identify relationships between the spurious frequencies and the related tone frequencies. In order to further assist a user, additional trajectories may be also included. The trajectories may represent specific relationships between the tone frequencies and further properties such as harmonics, clock rates etc. In this way, an easy, fast and reliable analysis of the spurious frequencies and the relationship between the spurious frequencies and the tone frequencies can be achieved. This relationship may be taken into account when evaluating the measurement results. Furthermore, the relationships of the spurious frequencies and the tone frequencies may be also used as a basis for identifying failures or further improving the device under test.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
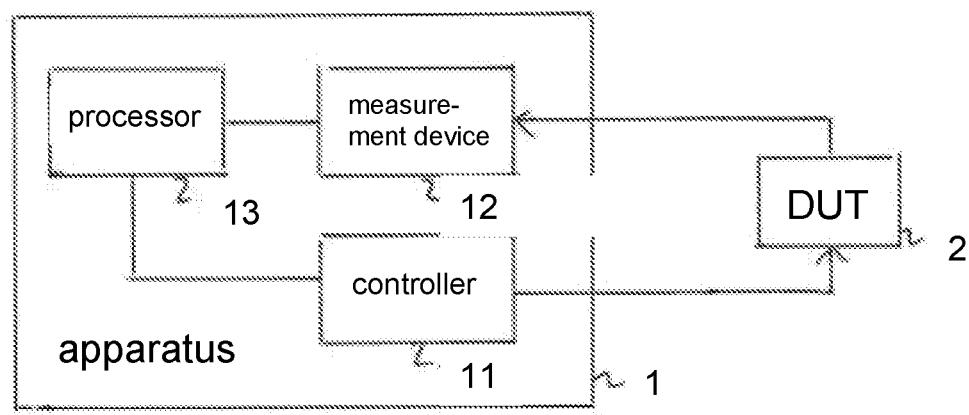
FIG. 1: shows a block diagram of an apparatus according to an embodiment of the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a schematic block diagram of an apparatus 1 for analyzing a relationship between a tone frequency and spurious frequencies. The apparatus 1 may comprise a controller 11, a measurement device 12 and a processor 13. In particular, apparatus 1 may analyze frequencies of a signal provided by a device under test 2. Device under test 2 may be any kind of device, which deals with a number of one or more signals having a specific frequency. In particular, device under test 2 may deal with signals of a specific radio frequency signal. For example, device under test 2 may be a device of a communication system such as a mobile communication network. For instance, device under test 2 may be a mobile communication device, a device or a component of a base station of a mobile communication network or any other kind of device of wired or wireless communication system. Furthermore, device under test 2 may be any other kind of device leading with radio frequency signals. For example, device under test 2 may be a device comprising one or more signal generators, in particular tunable signal generators for generating frequency signals with an adjustable frequency.

Controller 11 of the apparatus 1 may be communicatively coupled with device under test 2. For example, a wired or wireless communication link may be established between controller 11 and device under test 2. Controller 11 may send instructions or commands to device under test 2 in order to configure device under test 2 and to control device under test 2 to perform specific operations. In particular, controller 11 may control device under test 2 such that a specific predetermined frequency is generated by device under test 2. For example, device under test 2 may comprise a signal generator for generating a signal with an adjustable frequency, and controller 11 may set the frequency, which is generated by the signal generator of device under test 2. The signal generator of the device under test 2 may include, for example, a digital-to-analogue converter for converting digital data to an analogue, in particular an analogue signal having a specific frequency. However, it is understood that any other manner for generating a signal with a specific frequency may by possible, too.

Device under test 2 may further comprise, for example, one or more clock generators for generating a clock signal. For example, the clock signal may be provided to an analogue-to-digital converter or any other component of the device under test 2. In particular, the generated clock signal may be divided by one or more dividers in order to obtain a further clock signal having a lower clock rate. The generated clock signals may be used for any purpose. In particular, operations of the components in the device under test 2 may be synchronized based on a clock signal, or a clock signal may be used as a basis for generating further signals.

As already mentioned above, controller 11 of apparatus 1 may control an operation of device under test 2 such that device under test 2 generates a signal having a specific frequency. In the following, this specific frequency is denoted as "tone frequency". Device under test 2 may generate the signal with the frequency specified by controller 11 and provide a signal with the requested frequency. This signal with the requested frequency is provided to apparatus 1, in particular to measurement device 12 of apparatus 1.

Depending on the architecture of device 2, it may be possible that the generated signal comprises not only a frequency component with the requested tone frequency. Furthermore, the generated signal may comprise further frequency components. These additional frequency components may be unwanted frequency components. The additional frequency components are denoted as "spurious frequencies". For example, the generated signal may comprise harmonic or subharmonics frequency components. Further, it may be possible that the generated signal may comprise frequency components related to a clock signal of the device under test 2. Especially, if the generated signal is generated by combining two or more signals, for example by mixing multiple signals, it may be possible that the generated signal may also comprise frequency components of the base signals or further mixing products. However, it is understood, that the generated signal may comprise any other kind of additional frequency components. All these additional frequency components may be considered as spurious frequencies.

The generated signal with the requested tone frequency and the additional spurious frequencies is provided to measurement device 12 of apparatus 1. Accordingly, measurement device 12 receives the generated signal and determines a spectrum of the received signal. In particular, measurement device 12 may determine a spectrum of the received signal in a predetermined frequency range. The frequency range may cover the requested tone frequency and a further frequency range, in particular a frequency range, in which spurious frequencies are expected or at least a frequency range, in which spurious frequencies shall be analyzed. The frequency range may be fixed for all applications. However, it may be also possible that the frequency range may be individually configured for different applications, especially for different devices under test 2. The frequency range may be configured manually by a user. Alternatively, it may be also possible, that the frequency range may be set automatically depending on the received signal or any other appropriate parameter.

Measurement device 12 may provide the determined spectrum of the received frequency in any appropriate manner. For example, the spectrum may be provided by measuring the signal strength of multiple frequency components and providing for each measured frequency component corresponding signal strength. However, any other kind of providing the measured spectrum may be possible, too.

The spectrum, which is determined by a measurement device 12, may be provided to processor 13 of apparatus 1. For this purpose, processor 13 may be communicatively coupled with measurement device 12. Furthermore, processor 13 may be also communicatively coupled with controller 11. Accordingly, processor 13 may receive information of the frequency, which is used for controlling the signal generation of device under test 2. Furthermore, it may be also possible that processor 13 provides a specific frequency request to controller 11, and controller 11 controls device under test 2 based on the frequency request received from processor 13. However, it is understood, that any other scheme for specifying the frequencies may be also possible.

The spectrum, which is determined by the measurement device 12, is received by processor 13. Processor 13 analyzes the spectrum and may identify one or more spurious frequencies. Furthermore, processor 13 may determine a signal strength or amplitude for each identified spurious frequency.

The above identified procedure of controlling the device under test 2 to generate a specific tone frequency, measuring the respective signal generated by the device under test 2, determining the spectrum of the generated signal and identifying spurious frequencies may be performed for multiple tone frequencies. In particular, the before-mentioned procedure may be performed for a sequence of multiple tone frequencies, wherein the device under test 2 is controlled to generate a signal with the tone frequencies one by one. For example, it may be possible to specify a sequence of desired tone frequencies in advance and to control the device under test 2 to generate a signal with each of the tone frequencies subsequently. Furthermore, it may be possible to define a frequency range, for example to define a lowest frequency and a highest frequency and to control the device under test 2 to generate signals with multiple tone frequencies within this frequency range. For example, it may be possible to define a specific number of tone frequencies, which shall be generated in the specified frequency range. For this purpose, the frequency range may be divided into a number of intervals with same frequency distances. However, it may be also possible to apply a non-linear division of the frequency range. Furthermore, it may be also possible to specify a frequency interval and to generate signals with a specific tone frequency according to the specified frequency interval in the frequency range. It is understood, that any other approach for generating signals with respective tone frequencies may be possible, too.

After the apparatus 1 has performed the above-mentioned operation in order to acquire spurious frequencies for multiple tone frequencies, processor 13 may generate a representation including the identified spurious frequencies versus the respective tone frequencies. Some examples for such representations are described in more detail below.

Accordingly, by analyzing this representation of the spurious frequencies versus the related tone frequencies, it is possible to identify relationships between the tone frequencies and the spurious frequencies. For example, linear dependencies of the spurious frequencies with respect to the related tone frequencies can be identified.

In order to further improve the identification of the relationship between the tone frequencies and the spurious frequencies, it may be possible to indicate the signal strength/amplitude of the spurious frequencies in the representation. This will be also described in more detail below. Furthermore, it may be possible to limit the number of spurious frequencies, which are included in the representation of the spurious frequencies versus the tone frequencies. For example, only a predetermined maximum number of spurious frequencies may be included for each tone frequency in the representation. For instance, only three spurious frequencies may be used for each tone frequency when generating the representation. However, it is understood, that any other number may be used for limiting the spurious frequencies in the representation. Furthermore, it may be also possible to consider only spurious frequencies having a signal strength/amplitude, which is higher than a predetermined threshold value. Furthermore, any other kind of limitation may be used with respect to the spurious frequencies, which are included in the representation of the spurious frequencies versus the tone frequencies.

Figure 2:
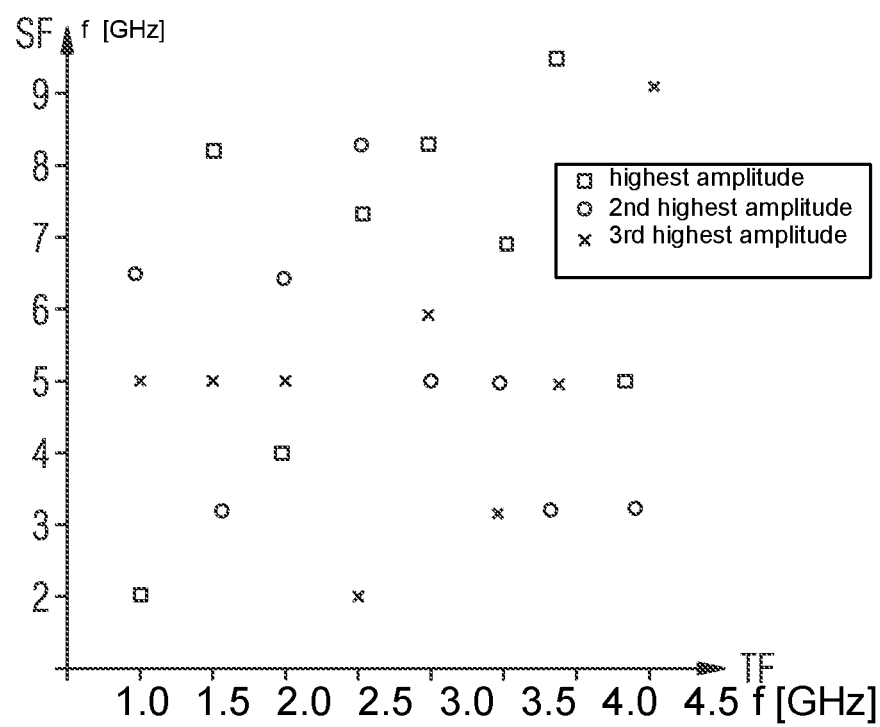
FIG. 2: shows a representation of spurious frequencies versus tone frequencies.

FIG. 2 shows an example for a representation of the spurious frequencies (SF) versus the tone frequencies (TF). In the example of FIG. 2, the number of spurious frequencies is limited to a maximum of three spurious frequencies per tone frequency. For each tone frequency, the spurious frequency having the highest amplitude is illustrated by a square sign, the spurious frequency having the second highest amplitude is illustrated by a circle sign, and the spurious frequency having the third highest amplitude is illustrated by an X-sign. However, it is understood, that any other scheme for illustrating the signal strength of the spurious frequencies may be possible, too. Furthermore, it may be also possible to include more or fewer spurious frequencies per tone frequency in the representation. For example, the representation may be a colored representation, wherein the amplitude of the spurious frequencies is illustrated by different colors. Furthermore, it may be also possible to illustrate the signal strength of the spurious frequencies by a variable size of the signs used for indicating the spurious frequencies in the representation.

In order to further improve the identification of relationships between the spurious frequencies and the tone frequencies, it may be possible to include additional indications into the representation. This additional indication may assist a user to identify particular properties, which may have impact to the spurious frequencies. For example, it may be possible to include one or more trajectories into the representation. Each trajectory may represent a specific feature or property of the device under test, a specific further signal or a relationship between a further signal and the tone frequencies, or any other specific property. In particular, the trajectories may relate to linear relationships with respect to the tone frequencies. However, any other kind of relationship between the tone frequencies at the trajectory may be also possible. It may be even possible that a trajectory may represent a specific constant offset or the like.

The trajectories may be computed based on one or more characteristic parameters of the device under test. For this purpose, the relevant characteristic parameters have to be received by the apparatus 1. For example, the relevant parameters may be manually input by a user, may be automatically obtained from the device under test 2 or may be determined based on additional measurements. However, any other manner for obtaining relevant characteristic parameters of the device under test 2 may be possible, too.

Figure 3:
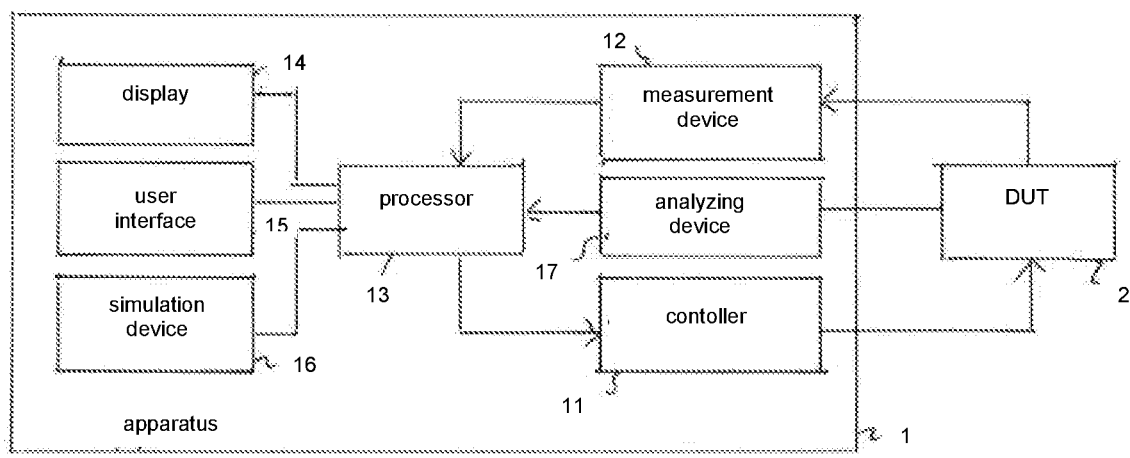
FIG. 3: shows a block diagram of an apparatus according to a further embodiment of the present invention.

FIG. 3 shows a block diagram of a further embodiment of an apparatus 1 for analyzing a relationship between tone frequencies and spurious frequencies. The apparatus 1 according to FIG. 3 mainly corresponds to the previously described apparatus 1 according to FIG. 1. Thus, all explanations above also apply to the apparatus 1 according to FIG. 3.

The apparatus 1 according to FIG. 3 may further comprise a display 14. Display 14 may be any kind of display for displaying the representation of the spurious frequencies versus the tone frequencies, which have been generated by processor 13. For example, display 14 may be a display such as an LCD or TFT display. However, any other kind of display may be possible, too. In particular, the display 14 may be a display, which is included in a housing comprising the further components of apparatus 1. However, it may be also possible to connect an external display such as an external computer monitor or the like for displaying the representation of the spurious frequencies versus the tone frequencies.

Apparatus 1 may further comprise a user interface 15, a simulation device 16 and/or an analyzing device 17. User interface 15 may receive any kind of input from a user. For example, user interface 15 may be a keyboard or any kind of buttons or knobs for entering user input. User interface 15 may be a pointing device such as a mouse or a trackball, a touchscreen or any other kind of appropriate device for entering user input. User interface 15 may be used for entering any kind of input from a user. In particular, a user may enter one or more specific parameters of the device under test 2. For example, a user may enter information regarding intermediate frequencies, clock rates, a frequency range of the device under test 2. Furthermore, a user may specify characteristics regarding an architecture such as mixers, frequency dividers or the like. However, any other kind of information regarding the properties of device under test may be also possible. Furthermore, it may be possible that a user may specify a type of the device under test 2. In this case, apparatus 1, for example processor 13, may refer to a database in order to retrieve relevant information regarding the device under test 2 from the database. The database may be a database included in apparatus 1, or an external database connected to apparatus 1 via any appropriate communication interface.

Simulation device 16 may be a processing device for simulating the operation of device under test 2 at least in part. For this purpose, simulation device 16 may refer to data which have been provided by a user via user interface 15, or data, which have been retrieved from an internal or external database. For example, simulation device 16 may perform a simulation of device under test 2 in order to obtain information regarding to internal signals, which may have impact to the signal, which is provided from device under test 2 to measurement device 12 of apparatus 1. For example, simulation device 16 may simulate effects causing harmonic or subharmonic frequencies, intermediate frequencies, frequencies relating to a mixing operation, or the like or any other kind of frequencies, which may occur in device under test 2. The simulation results may be also taken into account in order to identify relationships between spurious frequencies and tone frequencies.

Analyzing device 17 may measure one or more further signals of device under test 2. For example, analyzing device 17 may measure intermediate signals such as signals provided to a mixer, clock signals, signals of further circuits included in device under test 2 or any other signal of a circuit in device under test 2 or a signal related with device under test 2. For example, analyzing device 17 may identify one or more frequencies or frequency components of device under test 2, which may be responsible for spurious frequencies.

Analyzing device 17 and/or measurement device 12 may be, for example, a spectrum analyzer or the like. However, any other appropriate device may be possible, too.

The data provided by user interface 15, simulation device 16 and/or analyzing device 17 may be taken into account in order to identify possible sources, which may lead to spurious frequencies. Accordingly, theoretical relationships may be determined based on the before-mentioned data. These theoretical relationships may be optionally added to the representation of the spurious frequencies versus the frequencies. For example, one or more of the identified relationships may be represented by trajectories.

Figure 4:
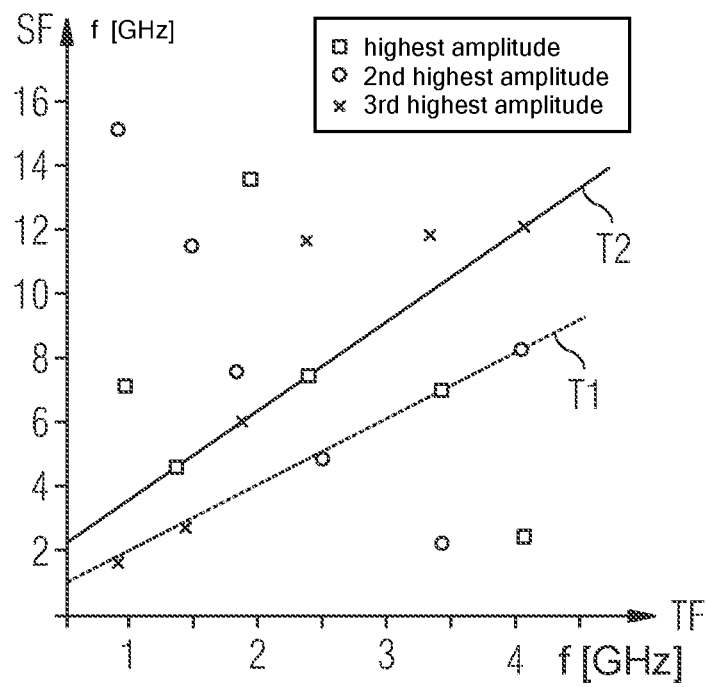
FIG. 4: shows a further representation of spurious frequencies versus tone frequencies.

FIG. 4 shows an example of a representation of spurious frequencies (SF) versus tone frequencies (TF). The representation according to FIG. 4 further comprises two trajectories T1 and T2. Trajectory T1 is a line representing two times the tone frequency, and trajectory T2 represents a line of three time the tone frequency. In this way, spurious frequencies on these trajectories T1 or T2 may be identified as harmonics of the tone frequency.

Figure 5:
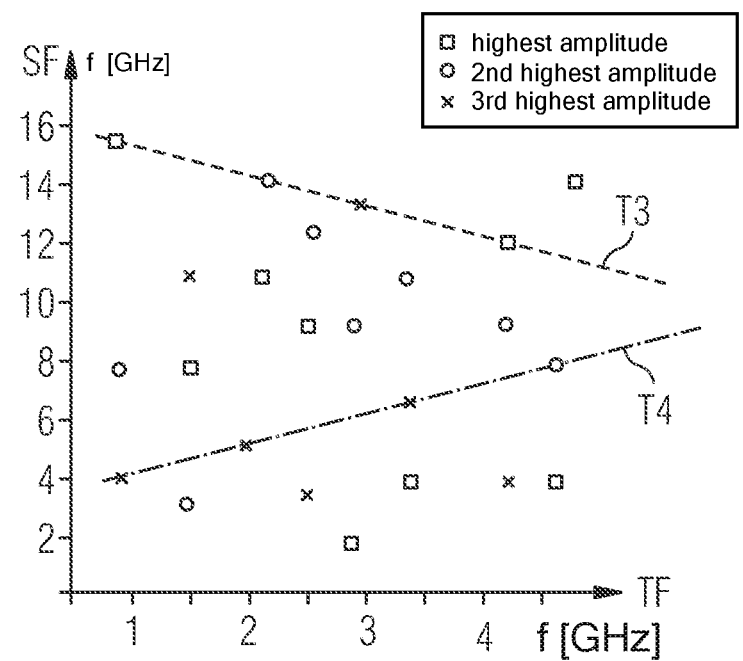
FIG. 5: shows still a further representation of spurious frequencies versus tone frequencies.

FIG. 5 shows a further representation of spurious frequencies versus tone frequencies with another example of trajectories. In this example, a third trajectory T3 is illustrated representing a first clock rate minus the tone frequency. A fourth trajectory T4 may illustrate another clock rate plus the tone frequency.

It is understood that the above described examples are only some examples of trajectories. Any other kind of trajectories may be also generated and included in the representation of the spurious frequencies versus the tone frequencies.

In particular, it may be possible that a user may manually specify one or more trajectories and the specified trajectories are included in the representation. For example, a menu of multiple possible trajectories may be provided to a user and a user may select one or more possible trajectories out of the provided menu. Alternatively, a user may specify one or more trajectories by entering a user defined formula or the like.

Furthermore, it may be also possible to automatically estimate one or more relationships between spurious frequencies and tone frequencies and to generate a respective trajectory. For example, processor 13 may analyze the identified spurious frequencies in order to automatically determine one or more relationships between spurious frequencies and tone frequencies. Based on this automatically determined relationship, a trajectory may be generated and included in the representation. Furthermore, the identified relationship may be also provided to a user. In this way, the user can easily compare the identified spurious frequencies with the corresponding trajectory in order to determine whether or not the automatically determined relationship may be appropriate.

Figure 6:
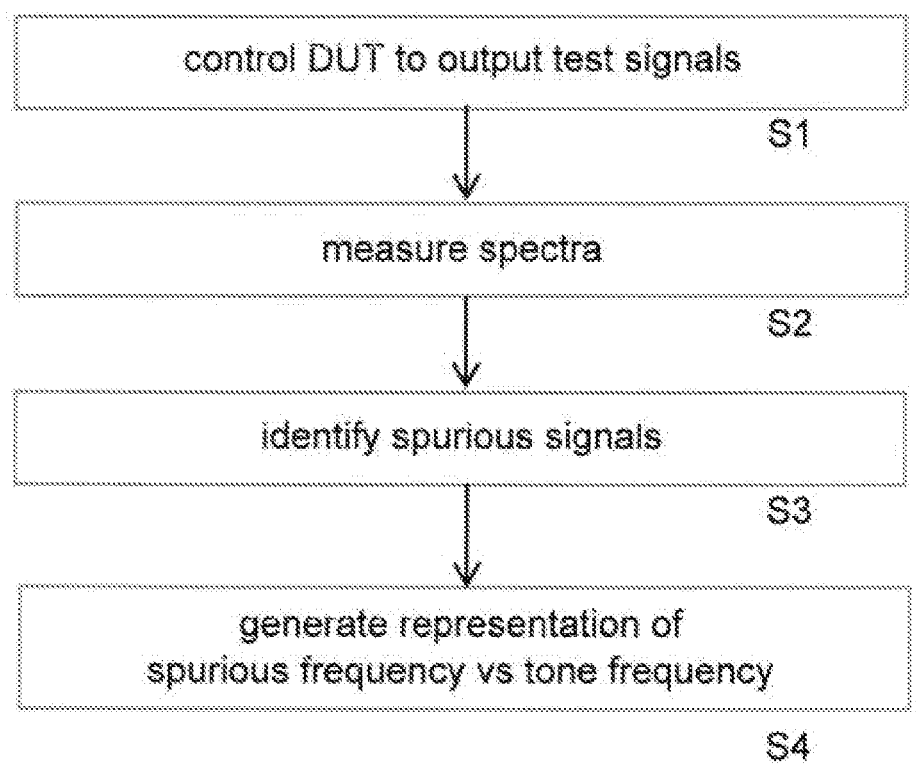
FIG. 6: shows a flow diagram illustrating a method according to an embodiment of the present invention.

FIG. 6 shows a flow diagram illustrating a method for analyzing a relationship between a tone frequency and spurious frequencies according to an embodiment. In general, the method may perform any operation, which has been already described above in connection with the apparatus 1 for determining a relationship between a tone frequency and spurious frequencies. Furthermore, the before described apparatus 1 may comprise elements for performing any step, which will be described below in connection with the method for analyzing the relationship between a tone frequency and spurious frequencies.

In a step S1, a device under test 2 is operated to output a number of signals. Each signal may relate to a predetermined tone frequency. In particular, the tone frequencies of the generated signals may be different from each other.

In a step S2, a spectrum of each signal, which is output by the device under test 2 is measured. In step S3, spurious frequencies are identified in the measured spectrums.

In step S4, a representation is generated, wherein the representation comprises the identified spurious frequencies in the measured spectrum versus the related tone frequency.

The method may further comprise determining a predetermined number of one or more strongest spurious frequencies of each measured spectrum.

Accordingly, the number of spurious frequencies for each tone frequency may be limited to a predetermined maximum number of spurious frequencies for each tone frequency, wherein only the strongest spurious frequencies are included in the representation.

The step of generating the representation may further comprise generating a separate representation for the strongest spurious frequency in each measured spectrum versus the related tone frequency. In particular, multiple representations may be generated. A first representation may comprise only the strongest spurious frequency for each tone frequency, a second representation may comprise the second strongest spurious frequency for each tone frequency, etc.

The method may further comprise computing a number of one or more trajectories of a theoretical spurious frequency versus the tone frequency. The computed trajectories may be included into the generated representation of the identified spurious frequencies versus the tone frequency.

The computed trajectory may be based on at least one of harmonics, subharmonics, aliased harmonics, mixing products or a clock frequency of the device under test 2.

The method may further comprise receiving a selection of one or more of the computed trajectories. Accordingly, only the selected one or more trajectories may be included in the generated representation.

The method may further comprise receiving one or more characteristic parameters of the device under test 2. Accordingly, the number of trajectories may be computed based on the received one or more characteristic parameters.

The one or more characteristic parameters of the device under test 2 may be received from a user by means of a user interface 15.

The one or more characteristic parameters of the device under test 2 may be measured by an analyzing device 17.

The one or more characteristic parameters of the device under test 2 may be computed based on a simulation of the device under test 2.

Summarizing, the present invention relates to an improved analysis and determination of a relationship between a tone frequency and spurious frequencies. For this purpose, a device under test is operated to generate signals based on multiple different tone frequencies. For each tone frequency a spectrum of the generated signal is measured and spurious frequencies in the generated signal are identified. Based on the measured spectrums a representation of the spurious frequencies versus the related tone frequencies is generated. Trajectories may be inserted into the representation for indicating relationships between the tone frequencies and the spurious frequencies. This representation provides a useful basis for a fast and reliable identification of relationships between spurious frequencies and tone frequencies.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

1 apparatus for determining relationship
2 device under test
11 controller
12 measurement device
13 processor
14 display
15 user interface
16 simulation device
17 analyzing device
T1 . . . T4 trajectories
S1 . . . S4 method steps

The invention claimed is:

1. A method for analyzing a relationship between tone frequencies and spurious frequencies, the method comprising:
    operating a device under test to output multiple signals, wherein each signal relates to a different one of multiple predetermined tone frequencies, wherein the device under test is operated to subsequently out-put one of said multiple signals
    measuring a spectrum of each signal which is output by the device under test;
    identifying one or more spurious frequencies in each of the measured spectrums; and
    generating a representation of the identified one or more spurious frequencies in each of the measured spectra versus related tone frequencies, wherein the related tone frequencies comprise said multiple predetermined tone frequencies caused by the device under test, and wherein the different one of multiple predetermined tone frequencies are plotted along a first axis and the identified one or more spurious frequencies in each of the measured spectrums are plotted along a second axis,
    wherein the step of identifying one or more spurious frequencies includes identifying a predetermined number of one or more strongest spurious frequencies for each of the measured spectra and the representation includes the identified predetermined number of strongest spurious frequencies per tone frequency, wherein each of the identified strongest spurious frequencies are represented separately according to an order of a respective amplitude in each of the measured spectra, per tone frequency.

2. The method of claim 1, comprising creating a further representation of amplitudes for a strongest spurious frequency for each of the measured spectra versus the related tone frequencies, wherein each of the one or more strongest spurious frequencies are identified based on an amplitude of a frequency component in one of the measured spectra.

3. The method of claim 1, comprising:
computing a number of one or more trajectories of a theoretical spurious frequency versus frequencies, and including the computed one or more trajectories into the generated representation of the identified one or more spurious frequencies versus the tone frequencies.

4. The method of claim 3, wherein the computed one or more trajectories are based on at least one of harmonics, subharmonics, aliased harmonics, mixing products or a clock frequency of the device under test or another signal source emitting unwanted signals.

5. The method of claim 3, comprising receiving a selection of one or more of the computed one or more trajectories, wherein only the selected one or more computed trajectories are included into the generated representation of the identified one or more spurious frequencies.

6. The method of claim 3, comprising receiving one or more characteristic parameters of the device under test, wherein the number of trajectories is computed based on the received one or more characteristic parameters.

7. The method of claim 6, wherein the one or more characteristic parameters of the device under test are received from a user interface.

8. The method of claim 6, wherein the one or more characteristic parameters of the device under test are determined by an analyzing device.

9. The method of claim 6, wherein the one or more characteristic parameters of the device under test are computed based on a simulation of the device under test.

10. The method of claim 1, wherein each signal generated by the device under test comprises multiple frequencies, a modulated signal having a carrier according to a frequency of said multiple predetermined tone frequencies or a signal related to a specific channel, wherein the channel is specified by a frequency of said multiple predetermined tone frequencies.

11. An apparatus for analyzing a relationship between tone frequencies and spurious frequencies, the apparatus comprises:
a controller for operating a device under test to output multiple signals, wherein each signal relates to one of multiple different predetermined tone frequencies, wherein the controller is configured to operate the device under test output subsequently one of said multiple signals;
a measurement device for measuring a spectrum of each signal which is output by the device under test; and
a processor for identifying one or more spurious frequencies in each of the measured spectrums, and for generating a representation of the identified one or more spurious frequencies in the measured spectra versus related tone frequencies, wherein the related tone frequencies comprise said multiple predetermined tone frequencies caused by the device under test, and wherein the different one of multiple predetermined tone frequencies are plotted along a first axis and the identified one or more spurious frequencies in each of the measured spectrums are plotted along a second axis,
wherein the step of identifying one or more spurious frequencies includes identifying a predetermined number of one or more strongest spurious frequencies for each of the measured spectra and the representation includes the identified predetermined number of strongest spurious frequencies per tone frequency, wherein each of the identified strongest spurious frequencies are represented separately according to an order of a respective amplitude in each of the measured spectra, per tone frequency.

12. The apparatus of claim 11, wherein the processor is configured to create a further representation of amplitudes for a strongest spurious frequency for each of the measured spectra versus the related tone frequencies, wherein each of the one or more strongest spurious frequencies are identified based on an amplitude of a frequency component in one or more measured spectra.

13. The apparatus of claim 11, wherein the processor is configured to compute a number of one or more trajectories of a theoretical spurious frequency versus frequencies, and to include the computed one or more trajectories into the generated representation of the identified one or more spurious frequencies versus the tone frequencies.

14. The apparatus of claim 13, wherein the one or more computed trajectories are based on at least one of harmonics, subharmonics, aliased harmonics, mixing products or a clock frequency of the device under test or another signal source emitting unwanted signals.

15. The apparatus of claim 13, comprising an input device for receiving a selection for one or more of the computed trajectories,
wherein the processor is configured to include only the selected one or more computed trajectories into the generated representation of the identified one or more spurious frequencies.

16. The apparatus of claim 13, comprising an input interface for receiving one or more characteristic parameters of the device under test,
wherein the processor is configured to compute the number of trajectories based on the received one or more characteristic parameters.

17. The method of claim 16, wherein the input interface is configured to receive the one or more characteristic parameters of the device under test from a user.

18. The method of claim 16, comprising an analyzing device, wherein the analyzing device is configured to measure the one or more characteristic parameters of the device under test.

19. The method of claim 16, comprising a simulation device configured to compute a simulation of the device under test,
wherein the one or more characteristic parameters of the device under test based on the computed simulation of the device under test.

20. The method of claim 11, wherein each signal generated by the device under test comprises multiple frequencies, a modulated signal having a carrier according to a frequency of said multiple predetermined tone frequencies, or a signal related to a specific channel, wherein the channel is specified by a frequency of said multiple predetermined tone frequencies.

* * * * *